United States Patent [19]

Kaganowicz

[11] 4,328,646
[45] May 11, 1982

[54] METHOD FOR PREPARING AN ABRASIVE COATING

[75] Inventor: Grzegorz Kaganowicz, Princeton, N.J.

[73] Assignee: RCA Corporation, New York, N.Y.

[21] Appl. No.: 963,819

[22] Filed: Nov. 27, 1978

[51] Int. Cl.³ .............................................. B24B 1/00
[52] U.S. Cl. .............................. 51/281 R; 51/283 R; 51/308; 427/38
[58] Field of Search .............. 427/38; 51/308, 281 R, 51/283 R

[56] References Cited
FOREIGN PATENT DOCUMENTS 1104935 3/1968 United Kingdom .
1136218 12/1968 United Kingdom .
1149052 4/1969 United Kingdom .

OTHER PUBLICATIONS

Joyce, Silicon . . . Discharge Thin Solid Films, 1 (1967/1968), 481–494.

Primary Examiner—Bernard D. Pianalto
Attorney, Agent, or Firm—Birgit E. Morris; Allen Bloom

[57] ABSTRACT

A method for preparing an abrasive coating from silane and an oxygen-containing gaseous compound such as $N_2O$, $CO_2$, $H_2O$ and the like is disclosed. The abrasive coating is prepared using the glow discharge method. The coating may be used to lap submicron articles.

4 Claims, 7 Drawing Figures

METHOD FOR PREPARING AN ABRASIVE COATING

This invention relates to a method of preparing an abrasive coating. More specifically, this invention relates to a method of preparing an abrasive coating by a glow discharge technique useful for the lapping of submicron articles.

BACKGROUND OF THE INVENTION

U.S. Pat. No. 3,842,194 of Jon K. Clemens disclosed a video disc having a playback system utilizing variable capacitance. In one configuration of the Clemens system information representative of recorded picture and sound is encoded in the form of a relief pattern in a relatively fine spiral groove on the surface of a disc record. For example, groove widths about 3.5 micrometers and groove depths of about 1.0 micrometer may be used. During playback a pickup stylus about 2.0 micrometers wide having a thin conductive electrode thereon, for example, about 0.2 micrometers thick, engages the groove as the record is rotated by a supportive turntable. Capacitive variations between the stylus electrode and the record surface are sensed to recover the pre-recorded information.

In the system of the above type the use of a relatively fine record groove and the groove engaging requirements for the pickup stylus results in a stylus tip which is extremely small.

In a copending application of Keizer entitled, "Keel-Tipped Stylus for Video Disc Systems", Ser. No. 781,317, filed Mar. 25, 1977, now U.S. Pat. No. 4,162,510 and incorporated herein by reference, a novel keel-tipped pickup stylus structure is disclosed. The keel-tipped pickup stylus comprises a dielectric support element having a body, a fore and aft constricted terminal portion and shoulders interconnecting the body with the constricted terminal portion.

In a second copending application of Keizer entitled, "Method for Forming Keel-Tipped Stylus for Video Disc Systems", Ser. No. 781,302, also filed Mar. 25, 1977, now U.S. Pat. No. 4,104,832, issued Aug. 8, 1978 and incorporated herein by reference, a flattened pyramidal shaped support element is shaped on an abrasive lapping disc having a deep, coarse-pitched groove for a predetermined time interval in order to obtain a keel-tipped stylus. Glow discharge deposited $SiO_2$ was used by Keizer as the abrasive coating and diamond was used as the dielectric stylus support material. In the second Keizer application, the $SiO_2$ layer is prepared by a method which utilizes as starting material oxygen and a dielectric precursor of an alkoxy-substituted silane of the formula

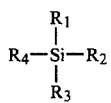

wherein $R_1$ is selected from the group consisting of H and $CH_3$, $R_2$ and $R_3$ are independently selected from the group consisting of H, $CH_3$, $OCH_3$ and $OC_2H_5$, and $R_4$ is selected from the group consisting of $OCH_3$ and $OC_2H_5$.

These coatings are not sufficiently abrasive and as a result periods as long as 30 minutes are needed to shape one diamond stylus. Furthermore, these coatings quickly lose their abrading ability and a second diamond stylus may require 2 hours to be lapped. Therefore, a more abrasive, long lasting, conformal coating fine enough to lap 2.0 micrometer wide diamond styli would be desirable.

SUMMARY OF THE INVENTION

A method of preparing an abrasive silicon oxide coating on a substrate comprising glow discharging silane and a gaseous oxygen compound in the presence of a substrate.

DETAILED DESCRIPTION OF THE INVENTION

The abrasive silicon oxide ($SiO_x$) material prepared according to the instant invention is prepared by first evacuating a vacuum chamber containing a suitable substrate to about $10^{-6}$ torr. A gaseous source of oxygen such as $N_2O$, $CO_2$, $H_2O$, $O_2$ and the like, alone or in combination, is introduced and silane ($SiH_4$) is then added. The $SiO_x$ coating is prepared by the glow discharge method in which a plasma is formed as a result of the decomposition of the starting materials in an electromagnetic field. A precipitate then deposits on the substrate. The value of x obtained in the formula $SiO_x$ depends upon the ratio of $SiH_4$ to the oxygen source. When the $SiO_2$ to SiO ratio is greater than about 1, preferably greater than 1.5, and most preferably is about 2.5, the coating becomes extremely abrasive.

In order to obtain the $SiO_x$ coating with a desired $SiO_2/SiO$ ratio, the partial pressure ratio between $SiH_4$ and $N_2O$ or $H_2O$ during deposition should be about 1:1 to about 1:8, preferably about 1:3 to about 1:8 and most preferably around 1:4. For $SiH_4$ and $CO_2$ the partial pressure ratio should be between about 2:1 to about 1:4, preferably about 1:1.5. The abrasive material prepared as above is believed to be microcrystalline $SiO_2$ particles embedded in an amorphous $SiO_x$ coating. The size of the $SiO_2$ crystallites is probably on the order of 50–300 angstroms in diameter.

The $SiO_x$ abrasive material may be deposited on any suitable substrate such as plastic, metal, glass and the like. Materials such as diamond, sapphire and the like may be lapped using this abrasive. A preferred substrate for lapping diamond styli for use with the capacitive video disc is a 12 inch (30.5 cm) vinyl substrate. The vinyl substrate may be coated with one or more metal layers such as copper, Inconel or the like.

Figure 1:
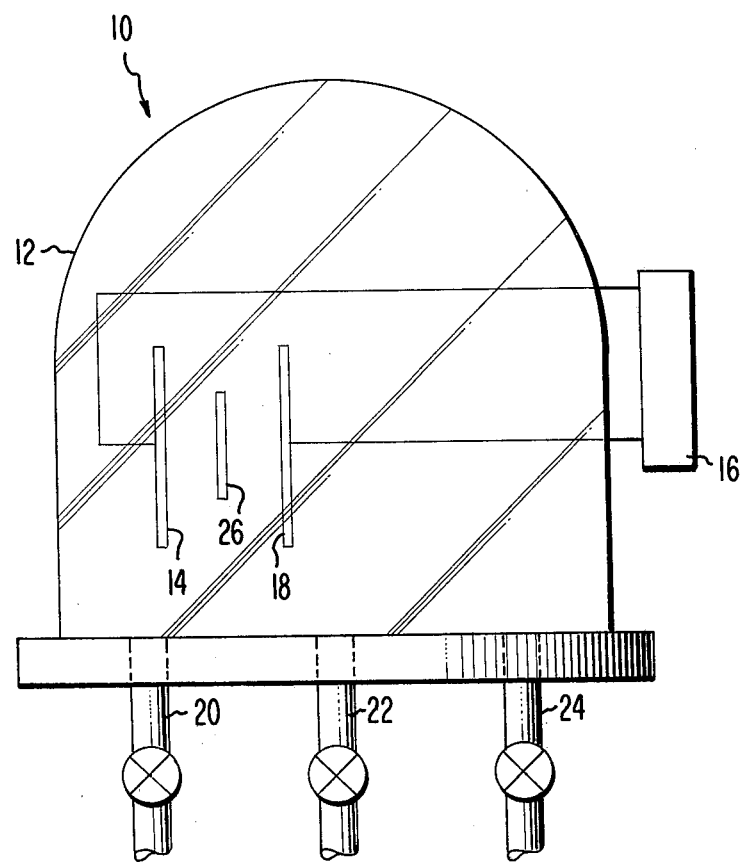
FIG. 1 is a cross-sectional view of an apparatus suitable for depositing the abrasive coating.

The invention will be further described by reference to the Drawings. A glow discharge apparatus suitable for preparing the abrasive material is shown in FIG. 1 generally as 10. The glow discharge apparatus 10 includes a vacuum chamber 12 such as a glass bell jar. In the vacuum chamber 12 are two electrodes 14 and 18 which can be a screen, coil or plate of a material that is a good electrical conductor such as platinum or graphite. The electrodes 14 and 18 are connected to an external power supply 16 which may be DC or AC. Thus, there will be a voltage potential between the electrodes 14 and 18. When low pressures and current frequencies other than radio frequencies are used, the plasma can be enhanced by means of magnets on the electrodes 14 and 18. A first outlet 20 into the vacuum chamber 12 allows for evacuation of the system and is connected to a mechanical pump, not shown. Inlets 22 and 24, respectively, are connected to gas bleed systems, not shown, for adding the reactants employed to prepare the abrasive material. In carrying out the process, a substrate 26 to be coated is placed between the electrodes 14 and 18, typically maintained about 5–10 cm apart. The vacuum chamber 12 is then evacuated through the first outlet 20 to a pressure of about $0.5-1 \times 10^{-6}$ torr. A gas which acts as a source of oxygen, is added through the inlet 22 to a partial pressure of about 30–35 microns of Hg. $SiH_4$ is added through the inlet 24 until the desired partial pressure ratio of $SiH_4$ to the oxygen source is obtained.

In order to begin deposition of an abrasive coating on the substrate 26, a glow discharge is initiated between the electrodes 14 and 18 by energizing the power supply 16. For deposition, the current should be in the range of 200–900 milliamps, more preferably 400–700 milliamps at a frequency of about 10 kilohertz. The potential between electrodes 14 and 18 is about 1000 volts. Under these conditions the abrasive coating is deposited on the substrate at the rate of about 50–600 angstroms per minute.

One application of the instant abrasive coating is in the shaping of diamond styli for use with capacitive video discs. A method for producing suitable styli was described in the previously discussed application of Keizer, Ser. No. 781,317, now U.S. Pat. No. 4,162,510. A front view of a pyramidal-shaped diamond stylus 100 is shown in a front view in FIG. 2. The front face 108 is defined by edges 102 and 104, and along with edge 106, define the other two faces. The front face 108, which acts as an electrode, is coated with a thin layer of a conductive material such as a 0.2 micrometer thick layer of hafnium. The apex of the pyramid 110 is shown.

Figure 3:
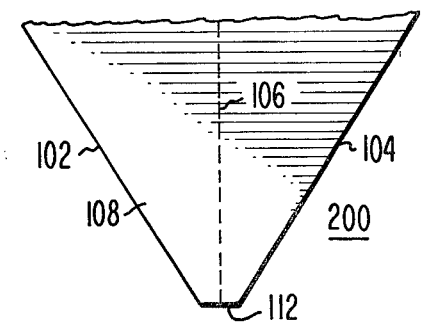
FIG. 3 is a front view of a stylus following shoe lapping.
Figure 4:
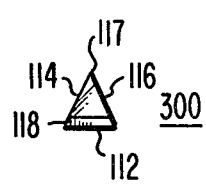
FIG. 4 is the footprint of a stylus following shoe lapping.

Following shoe lapping on a grooveless substrate coated with an abrasive layer such as that of the instant invention, the apex 110 has been lapped to a flattened shoe with its edge 112 on stylus 200 as shown as a front view in FIG. 3. A bottom view of the stylus 200 is the footprint 300 shown in FIG. 4. The edges defining the footprint are 112, 114 and 116. The front face 108 of the stylus 200 is coated with a thin layer 118 of a conductive material such as hafnium. The apex 117 of the triangular footprint 300 is shown.

Figure 5:
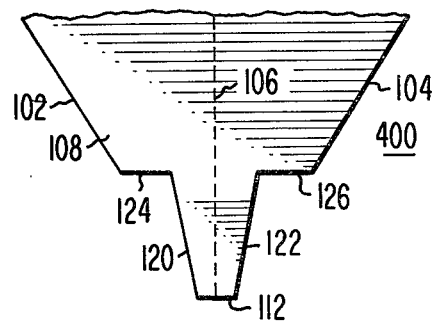
FIG. 5 is a front view of a stylus following keel lapping.

The keel of the stylus is now shaped by means of a coarse pitched deep groove in a disc described in Keizer, Ser. No. 781,317, now U.S. Pat. No. 4,162,510. The disc is coated with an abrasive $SiO_x$ layer of the instant invention. The stylus 400 following keel lapping is shown in FIG. 5. The keel is defined by sides 120 and 122, shoulders 124 and 126 and edge 112. The angle between the edge 112 and the sides 120 or 122 is generally somewhat greater than 90 degrees, preferably in the range of about 100–110 degrees.

Figure 6:
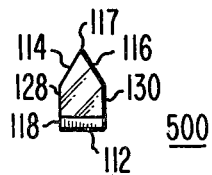
FIG. 6 is the footprint of a stylus following keel lapping.

The footprint 500 of the keel lapped stylus 400 is shown in FIG. 6. The pentagonally shaped footprint is defined by the front edge 112, the parallel edges 128 and 130 and the rear edges 114 and 116 which meet at the apex 117. The front face 108 of the stylus 400 is covered with a thin conductive layer 118.

Figure 7:
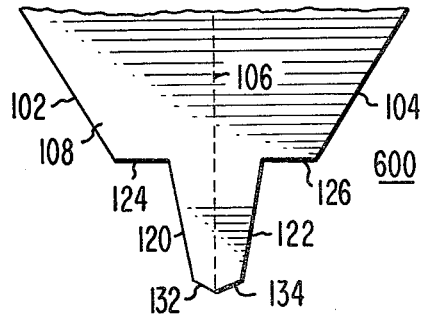
FIG. 7 is a front view of a stylus following "V" lapping.

The final "V"-lapping step utilizes a vinyl video disc replica coated with the abrasive $SiO_x$ material of the instant invention or with an $SiO_2$ coating. The purpose of the "V"-lapping step is to obtain a stylus which conforms to the shape of the actual video disc grooves. Such a "V"-lapped stylus 600 is shown in FIG. 7. In the front view of stylus 600 the "V" is defined by edges 132 and 134. The angle formed by the intersection of 132 and the edges 134 is shallow, generally about 140 degrees.

The invention will be further illustrated by the following Examples, but it is to be understood that the invention is not meant to be limited by the details described therein.

EXAMPLE 1

A 30.5 cm diameter vinyl disc containing a spiral groove and coated with a metal bilayer comprising a Cu layer about 50 angstroms thick and a 200 angstrom thick layer of Inconel 600 (76.8 atom percent of nickel, 13.8 atom percent of chromium and 8.5 atom percent of iron) was placed in a 46 cm×76 cm bell jar as described in FIG. 1 which was then evacuated to $10^{-6}$ torr. $N_2O$ was added to a partial pressure of 32 microns using a flow of 35 standard cubic centimeters per minute (sccm). $SiH_4$ was then added to a total pressure of 40 microns. The partial pressure ratio of $SiH_4$ to $N_2O$ was 1:4.

The disc substrate was rotated at a rate of 30 rpm between two 15 cm×15 cm metal electrodes. These electrodes covered a strip approximately 6 cm wide on the disc. To operate a glow between the electrodes, current was supplied to the electrodes at a rate of 500 milliamps with a potential of about 1000 volts at 10 KHz. Deposition of an abrasive coating onto the disc started which was continued for 1.5 minutes. The deposited coating was 250 angstroms thick. As determined by IR analysis, the $SiO_2$ to $SiO$ ratio of the coating was about 2.5.

For the first pass, it took about 5 minutes by rotating the abrasive coated disc at 72 rpm to keel lap the stylus 400 as shown in FIG. 5. The length of the shoe footprint 500 shown in FIG. 6. was about 4 microns from the edge 112 to the apex 117. During subsequent passes the time necessary to lap a similar stylus to the same size increased by 10–15 percent with each subsequent pass. Thus, on the eighth pass it took about 15 minutes to keel lap a similar stylus to the 4 micron length.

CONTROL 1

Similar metal coated and configured discs as in Example 1 were coated with a 250 angstrom thick layer of an abrasive $SiO_2$ coating obtained by a glow discharge deposition of methyldimethoxysilane and $O_2$. These records were used to keel lap a diamond stylus 400 as in FIG. 5. Thirty minutes were required to keel lap a diamond stylus during the first pass to a length of 4 microns between edge 112 and apex 117 as shown in FIG. 6. On the second pass over the same grooves 2 hours were required to lap the stylus to a similar length.

EXAMPLE 2

Figure 2:
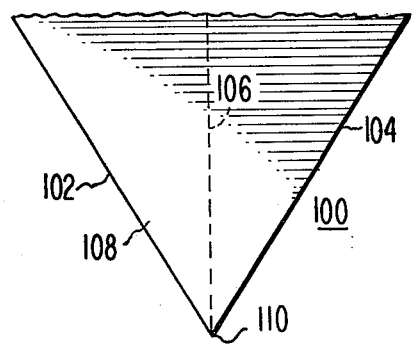
FIG. 2 is a front view of a stylus.

Pyramidal-shaped diamond styli 100, as described in FIG. 2, were shoe lapped to form styli 200 as in FIG. 3 using a grooveless vinyl disc coated with a coating of $SiO_x$ 2000 angstroms thick prepared as in Example 1. Two to ten seconds were required to shoe lap the styli so that edge 112 was about 1.6 micrometers long.

CONTROL 2

Using grooveless vinyl discs which were coated with 2000 angstroms of $SiO_2$ prepared as described in Control 1, 5–30 minutes were required to shoe lap diamond styli 100 shown in FIG. 2 to styli 200 shown in FIG. 3 so that the edge 112 was about 1.6 micrometers in length.

EXAMPLE 3

A vinyl video disc replica with an abrasive $SiO_x$ coating, prepared as described in Example 1, was used to "V" lap a diamond styli 400 shown in FIG. 5 to styli 600 shown in FIG. 7. Five to 10 seconds were required to form the desired shape.

CONTROL 3

Using a vinyl video disc replica and an $SiO_2$ coating as described in Control 1, four minutes were required to "V" lap a stylus 400 to the shape of the stylus 600 shown in FIG. 7.

EXAMPLE 4

The procedure of Example 1 was followed except substituting $H_2O$ for $N_2O$, the partial pressure ratio of $SiH_4$ to $H_2O$ being 1:4.

The resultant 250 angstrom thick coating keel lapped a diamond stylus 200, shown in FIG. 3, to stylus 400, shown in FIG. 5, in 10 minutes. The length between the edge 112 and the apex 117 of the footprint 500 shown in FIG. 6 was 3.5 micrometers.

EXAMPLE 5

The procedure of Example 1 was carried out substituting $CO_2$ for $N_2O$. The partial pressure ratio of $SiH_4$ to $CO_2$ was 1:2. A 250 angstrom thick coating was prepared using a deposition rate of 150 angstroms per minute.

The time to keel lap a diamond stylus 200, shown in FIG. 3 to stylus 400 in FIG. 5, was 5 minutes. The length between the footprint 500 edge 112 and the apex 117 was about 4.0 micrometers.

I claim:

1. In a method for lapping an article of submicron dimensions comprising the steps of:
   glow discharging a mixture of silicon- and oxygen-containing precursors of $SiO_x$;
   depositing the product onto a substrate;
   establishing relative motion between said substrate and article to be lapped; and
   contacting said article with said deposited product; the improvement which comprises using as the precursors $SiH_4$ and a gaseous compound selected from the group consisting of $N_2O$, $CO_2$ and $H_2O$.

2. The method of claim 1 wherein said substrate is vinyl.

3. The method of claim 1 wherein said substrate is metal coated vinyl.

4. In a method of fabricating a keel-tipped stylus by modifying a tapering support element having a tip which is defined by a prow and a substantially flat V-shaped rear surface remote from said prow; said keel-tipped stylus being suitable for playing back prerecorded signals from a disc record groove of a given width and a given pitch; said method comprising the steps of:
   introducing said tip of said tapering support element in an abrasive groove having a bottom wall, substantially parallel side walls separated by a distance less than said given width and lands extending away from said side walls; while
   establishing relative motion between said tapering support element and said abrasive groove along a line which is disposed in a plane substantially perpendicular to said V-shaped rear surface;
   said side walls of said abrasive groove forming side surfaces of a fore-and-aft constricted terminal portion of said tapering support element;
   said lands of said abrasive groove forming shoulders interconnecting said constricted terminal portion with remainder of said tapering support element; and
   terminating said relative motion when said constricted terminal portion reaches a given height;
   the improvement which comprises glow discharging $SiH_4$ and a gaseous compound selected from the group consisting of $N_2O$, $CO_2$ and $H_2O$; and
   depositing a silicon oxide abrasive layer onto a groove to obtain the abrasive groove.

* * * * *